(12) United States Patent
Inaba et al.

(10) Patent No.: US 8,097,903 B2
(45) Date of Patent: Jan. 17, 2012

(54) SEMICONDUCTOR MEMORY DEVICE

(75) Inventors: Tsuneo Inaba, Kamakura (JP); Hideo Mukai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 517 days.

(21) Appl. No.: 12/402,758

(22) Filed: Mar. 12, 2009

(65) Prior Publication Data

US 2009/0230434 A1 Sep. 17, 2009

(30) Foreign Application Priority Data

Mar. 17, 2008 (JP) .................................. 2008-68422

(51) Int. Cl.
*H01L 29/04* (2006.01)
(52) U.S. Cl. .................... 257/211; 257/3; 257/E45.002; 257/E27.004
(58) Field of Classification Search .............. 257/3, 211, 257/E45.002, E27.004, E27.026
See application file for complete search history.

(56) References Cited

U.S. PATENT DOCUMENTS

| | | | |
|---|---|---|---|
| 6,141,241 A | 10/2000 | Ovshinsky et al. | |
| 7,291,878 B2 * | 11/2007 | Stipe | 257/296 |
| 2009/0168481 A1 * | 7/2009 | Stipe | 365/51 |
| 2010/0264393 A1 * | 10/2010 | Mikawa et al. | 257/2 |

FOREIGN PATENT DOCUMENTS

| | | |
|---|---|---|
| JP | 2002-541613 | 12/2002 |
| WO | WO 00/62301 | 10/2000 |

* cited by examiner

*Primary Examiner* — Mary Wilczewski
*Assistant Examiner* — Toniae Thomas
(74) *Attorney, Agent, or Firm* — Oblon, Spivak, McClelland, Maier & Neustadt, L.L.P.

(57) ABSTRACT

A semiconductor memory device comprises a semiconductor substrate; a memory block formed on the semiconductor substrate and including plural stacked cell array layers of cell arrays each comprising a plurality of first lines, a plurality of second lines crossing the plurality of first lines, and memory cells connected at intersections of the first and second lines between both lines; and a plurality of contacts extending in the stack direction of the cell array layers and connecting the first lines in the cell arrays with diffusion regions formed on the semiconductor substrate. A certain one of the cell array layers is smaller in the number of the first lines divided and the number of contacts connected than the cell array layers in a lower layer located closer to the semiconductor substrate than the certain one.

20 Claims, 11 Drawing Sheets

SEMICONDUCTOR MEMORY DEVICE

CROSS-REFERENCE TO RELATED APPLICATION

This application is based upon and claims the benefit of priority from the prior Japanese Patent Application No. 2008-68422, filed on Mar. 17, 2008, the entire contents of which are incorporated herein by reference.

BACKGROUND OF THE INVENTION

1. Field of the Invention

The present invention relates to a semiconductor memory device, and more particularly to the number of lines divided and the number of contacts in a nonvolatile semiconductor memory device having a three-dimensional stacked structure.

2. Description of the Related Art

In recent years, a large-capacity and low-price nonvolatile semiconductor memory device such as a flash memory has expanded the use and market as a storage memory, for example, a memory card and a semiconductor drive device (the so-called SSD: Solid State Drive). The storage memory has been required to have a much larger capacity and lower cost and, for the purpose of realization, process dimensions have been reduced progressively. A flash memory of the conventional type, however, has a limit on the 20-30 nm generation as is said in the art and therefore nonvolatile semiconductor memory devices such as a ReRAM (Resistive RAM) and a PCRAM (Phase Change RAM) including resistive memory elements have received attention as successive candidates and have been developed progressively (Patent Document 1: JP 2002-541613T).

The PCRAM is also referred to as the phase change memory and changes the crystal structure of the resistive memory element, thereby changing the resistance of the element to store information. For example, when the memory element is to be changed to a high-resistance state, current is supplied to the element for heating, and then the element is quenched, thereby turning the crystal structure into the amorphous (non-crystalline) state. When the memory element is to be changed to a low-resistance state, current is supplied to the element for heating, and then the element is slowly cooled for crystallization. It has a characteristic in switching between the high-resistance state and the low-resistance state controllable with one directional current but a disadvantage on a relatively large current required in writing.

On the other hand, available examples of the resistive memory element utilized in the ReRAM include a transition metal oxide and so forth. The resistive memory element has two types of operation modes as known. One is referred to as the bipolar type, which switches the polarity of the voltage applied to the element between the normal and the reverse, thereby switching between the high-resistance state and the low-resistance state. The other is referred to as the unipolar type, which retains the polarity of the voltage applied to the element unchanged in one direction and controls the voltage value and application time of the voltage applied, thereby switching between the high-resistance state and the low-resistance state.

In the case of the memory element of the unipolar type, a memory cell configuration of the so-called 1D1R type, including a resistive memory element and a diode connected in series using no memory-cell selection transistor, can realize memory cells of the so-called cross-point type capable of arranging memory cells at intersections of bit lines and word lines. The memory cell of the cross-point type has a cell size as small as $4F^2$ and accordingly can realize a high-density memory cell array as an advantage.

Further, the memory cell of the cross-point type uses no selection transistor and accordingly allows memory cell arrays to be stacked relatively easy as an advantage. In the case of the stacked memory cell arrays, the area of the memory cell array is kept unchanged while the memory capacity (integration) can be made higher. Accordingly, it is possible to realize a larger capacity and a lower cost together. Further, the larger capacity can be achieved without fine patterning and accordingly the development costs can be reduced to realize the nonvolatile semiconductor memory device at lower costs.

Even if the memory cell arrays are stacked, however, transistors contained in circuits such as a sense amplifier and a row decoder are formed on a substrate like the prior art. Therefore, as for the contact regions for connecting the stacked bit lines and word lines with these circuits, the area of the contact regions increases as the number of stacked layers increases. This increases the chip area and prevents achievement of lower costs as a problem.

SUMMARY OF THE INVENTION

In an aspect the present invention provides a semiconductor memory device, comprising: a semiconductor substrate; a memory block formed on said semiconductor substrate and including plural stacked cell array layers of cell arrays each comprising a plurality of first lines, a plurality of second lines crossing said plurality of first lines, and memory cells connected at intersections of said first and second lines between both lines; and a plurality of contacts extending in the stack direction of said cell array layers and connecting said first lines in said cell arrays with diffusion regions formed on said semiconductor substrate, wherein a certain one of said cell array layers is smaller in the number of said first lines divided and the number of contacts connected than said cell array layer in a lower layer located closer to said semiconductor substrate than said certain one.

In another aspect the present invention provides a semiconductor memory device, comprising: a semiconductor substrate; a memory block formed on said semiconductor substrate and including plural stacked cell array layers of cell arrays each comprising a plurality of first lines, a plurality of second lines crossing said plurality of first lines, and memory cells connected at intersections of said first and second lines between both lines; and a plurality of contacts extending in the stack direction of said cell array layers and connecting said first lines in said cell arrays with diffusion regions formed on said semiconductor substrate, wherein a certain one of said cell array layers is smaller in the number of said first lines divided than said cell array layer in a lower layer located closer to said semiconductor substrate than said certain one, wherein said first line in said cell array layer in an upper layer is connected to diffusion regions formed on said semiconductor substrate via said contact passing through the dividing space between said first lines in said cell array layer in said lower layer.

In another aspect the present invention provides a semiconductor memory device, comprising: a semiconductor substrate; a memory block formed on said semiconductor substrate and including plural stacked cell array layers of cell arrays each comprising a plurality of first lines, a plurality of second lines crossing said plurality of first lines, and memory cells connected at intersections of said first and second lines between both lines; and a plurality of contacts extending in the stack direction of said cell array layers and connecting said first lines in said cell arrays with diffusion regions formed on said semiconductor substrate, wherein a certain one of said cell array layers is smaller in the number of said first lines divided than said cell array layer in a lower layer located closer to said semiconductor substrate than said certain one, and has said memory in a portion of said first line, corresponding to the dividing space between said first lines in said cell array layer in said lower layer.

DETAILED DESCRIPTION OF THE EMBODIMENTS

The embodiments associated with the semiconductor memory device according to the present invention will now be described in detail with reference to the drawings.

First Embodiment

Figure 1:
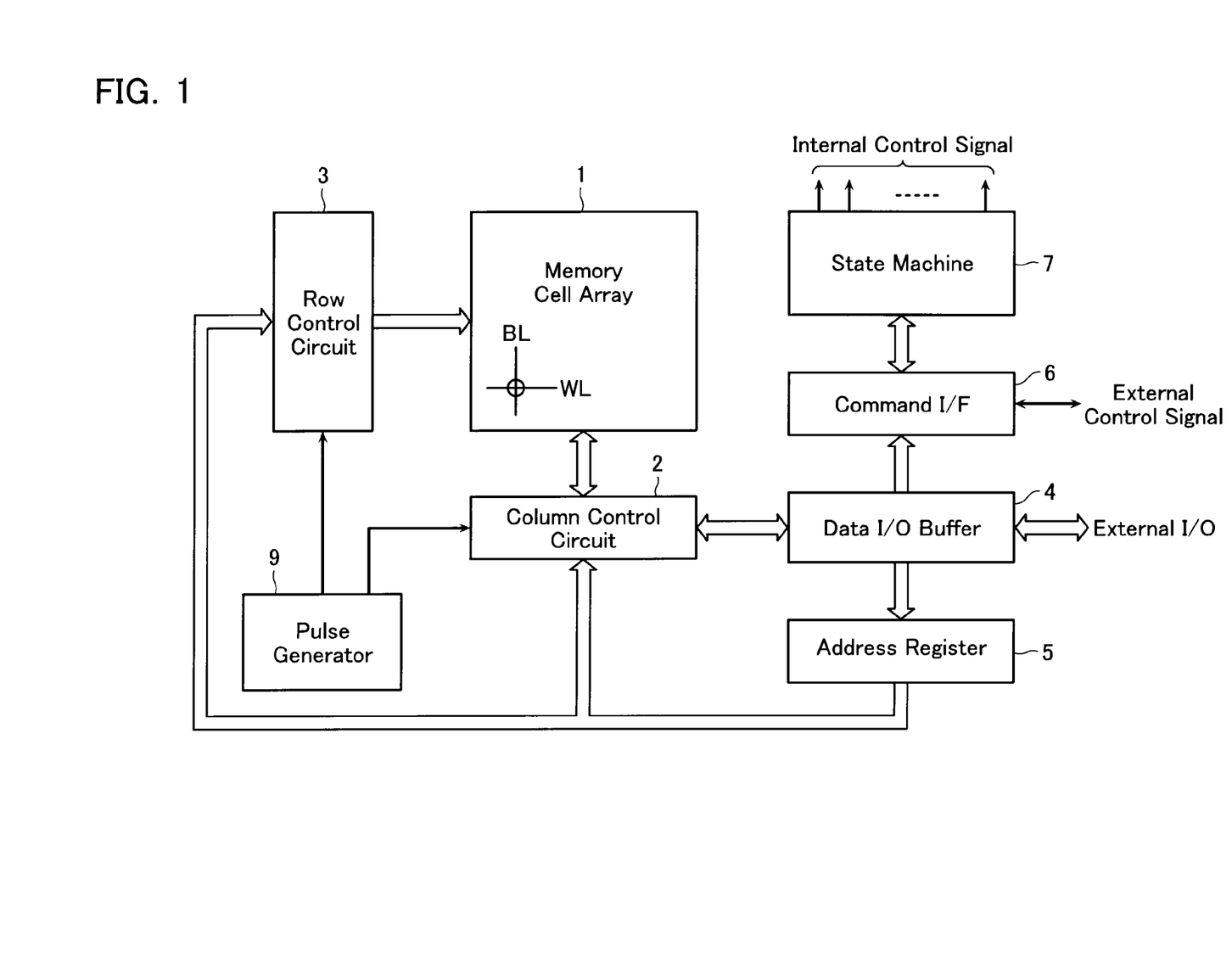
FIG. 1 is a block diagram of a semiconductor memory device according to a first embodiment of the present invention.

FIG. 1 is a block diagram of a semiconductor memory device according to a first embodiment of the present invention.

The semiconductor memory device comprises a memory cell array 1 of memory cells arranged in matrix, each including a later-described variable resistive element, as in a PCRAM (Phase-Change RAM) and a ReRAM (Resistive RAM). A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell. The column control circuit 2 and the row control circuit 3 configure a data read/write circuit for use in data read/write to the memory cell array 1.

A data I/O buffer 4 is connected to an external host device, not shown, to receive write data, receive erase instructions, provide read data, and receive address data and command data from/to the host device. The data I/O buffer 4 sends received write data to the column control circuit 2 and receives read-out data from the column control circuit 2 and provides it to external. An address fed from the external host device to the data I/O buffer 4 is sent via an address register 5 to the column control circuit 2 and the row control circuit 3. A command fed from the external host device to the data I/O buffer 4 is sent to a command interface 6. The command interface 6 receives an external control signal from external and decides whether the data fed to the data I/O buffer 4 is write data, a command or an address. If it is a command, then the command interface transfers it as a received command signal to a state machine 7. The state machine 7 manages the entire semiconductor memory device to receive commands from the external host device, read, write, erase, and execute data I/O management. The external host device can also receive status information managed by the state machine 7 and decide the operation result. The status information is also utilized in control of write and erase.

The state machine 7 controls the pulse generator 8. Under this control, the pulse generator 8 is allowed to provide a pulse of any voltage at any timing. The pulse formed herein can be transferred to any line selected by the column control circuit 2 and the row control circuit 3.

Peripheral circuit elements other than the memory cell array 1 can be formed in a silicon substrate immediately beneath the memory array 1 formed in a wiring layer. Thus, the chip area of the semiconductor memory device can be made almost equal to the area of the memory cell array 1.

Figure 2:
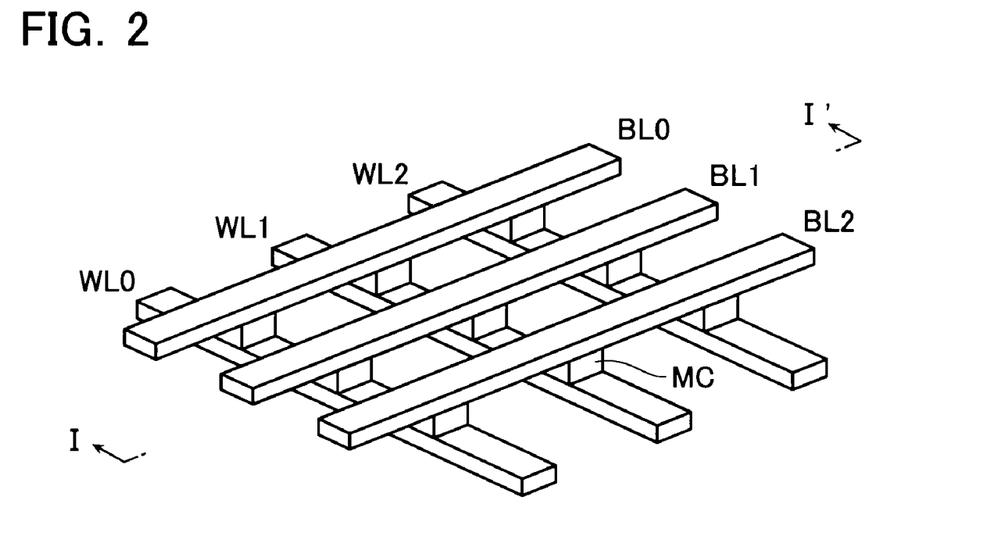
FIG. 2 is a perspective view of part of a cell array in the semiconductor memory device according to the same embodiment.
Figure 3:
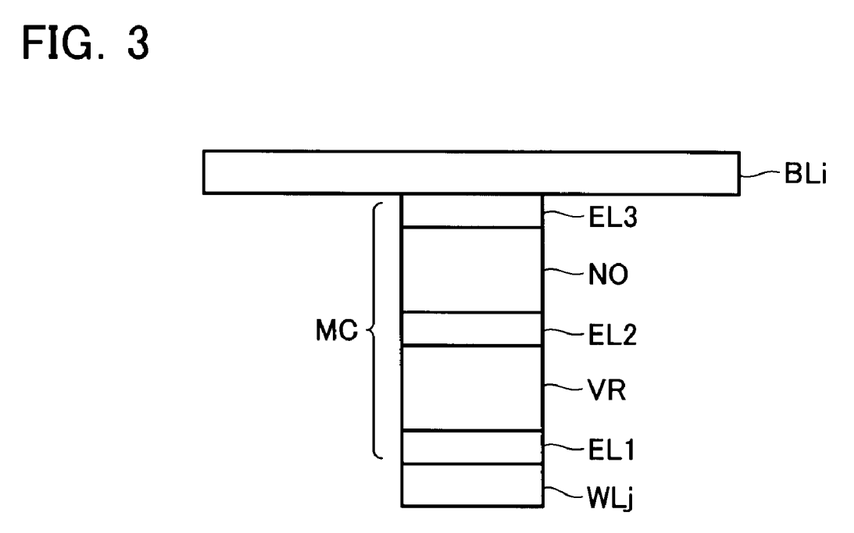
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines orbit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistive element VR and a non-ohmic element NO as shown in FIG. 3.

The variable resistive element VR can vary the resistance through current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrO$_x$, PtRhO$_x$, Rh/TaAlN. A metal film capable of achieving uniform orientation may also be interposed. A buffer layer, a barrier metal layer and an adhesive layer may further be interposed.

Available examples of the variable resistive element VR include: one that changes the resistance in accordance with a phase change between the crystalline state and the amorphous state, such as a chalcogenide (PCRAM); one that changes the resistance by precipitating metal cations to form a bridge (conducting bridge) between electrodes and ionizing the precipitated metal to destruct the bridge (CBRAM); and one that changes the resistance by applying a voltage or current (ReRAM) (which is roughly divided into one that causes a variation in resistance in accordance with the presence/absence of charge trapped in charge traps present in the electrode interface, and one that causes a variation in resistance in accordance with the presence/absence of the conduction path due to an oxygen loss and so forth).

Figure 4:
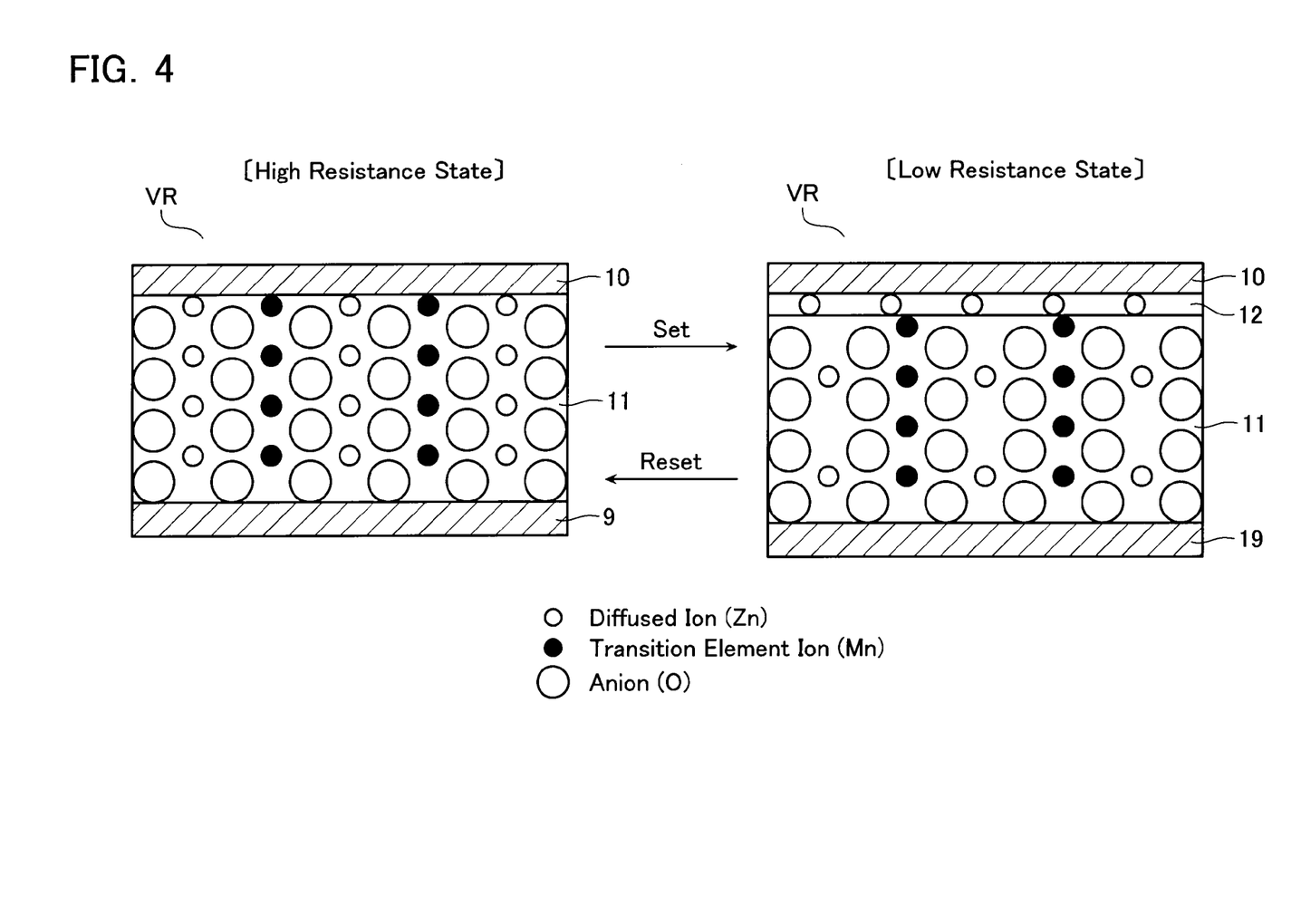
FIG. 4 is a schematic cross-sectional view showing a variable resistive element example in the same embodiment.

FIG. 4 shows an example of the ReRAM. The variable resistive element VR shown in FIG. 4 includes a recording layer 11 arranged between electrode layers 9, 10. The recording layer 11 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula A$_x$M$_y$X$_z$ (A and M are different elements) and may be formed of material having a crystal structure such as a spinel structure (AM$_2$O$_4$), an ilmenite structure (AMO$_3$), a delafossite structure (AMO$_2$), a LiMoN$_2$ structure (AMN$_2$), a wolframite structure (AMO$_4$), an olivine structure (A$_2$MO$_4$), a hollandite structure (A$_x$MO$_2$), a ramsdellite structure (A$_x$MO$_2$), and a perovskite structure (AMO$_3$).

In the example of FIG. 4, A comprises Zn, M comprises Mn, and X comprises O. In the recording layer 11, a small white circle represents a diffused ion (Zn), a large white circle represents an anion (O), and a small black circle represents a transition element ion (Mn). The initial state of the recording layer 11 is the high-resistance state. When the electrode layer 9 is kept at a fixed potential and a negative voltage is applied to the electrode layer 10, part of diffused ions in the recording layer 11 migrate toward the electrode layer 10 to reduce diffused ions in the recording layer 11 relative to anions. The diffused ions arrived at the electrode layer 10 accept electrons from the electrode layer 10 and precipitate as a metal, thereby forming a metal layer 12. Inside the recording layer 11, anions become excessive and consequently increase the valence of the transition element ion in the recording layer 11. As a result, the carrier injection brings the recording layer 11 into electron conduction and thus completes setting. On regeneration, a current may be allowed to flow, of which value is very small so that the material configuring the recording layer 11 causes no resistance variation. The programmed state (low-resistance state) may be reset to the initial state (high-resistance state) by supplying a large current flow in the recording layer 11 for sufficient time, which causes Joule heating to facilitate the oxidation reduction reaction in the recording layer 11. Application of an electric field in the opposite direction from that at the time of setting may also allow resetting.

Figure 5A:
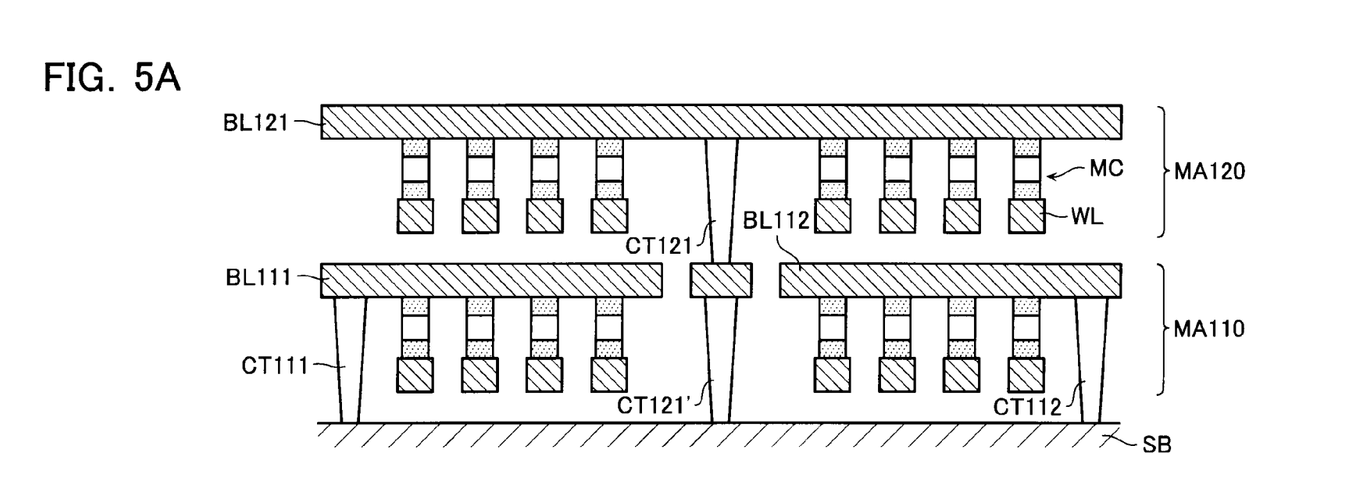
FIG. 5A is a cross-sectional view showing an arrangement of memory cells, word lines, bit lines and contacts in the semiconductor memory device according to the same embodiment.

FIG. 5A is a cross-sectional view showing an arrangement of memory cells, word lines, bit lines and contacts in the present embodiment.

There is a silicon substrate SB, on which a cell array layer MA110 in a lower layer and a cell array layer MA120 in an upper layer are formed.

The cell array layer MA110 in the lower layer includes a plurality of first lines or bit lines BL and a plurality of second lines or word lines WL intersecting the bit lines BL. A bit line BL is divided at the center into a bit line BL111 and a bit line BL112. At intersections of the word lines WL and the bit lines BL111 and BL112, memory cells MC of the cross-point type shown in FIG. 3 are formed. The bit lines BL111 and BL112 are connected to a column control circuit, not shown, on the silicon substrate SB via contacts CT111 and CT112, respectively.

The cell array layer MA120 in the upper layer on the other hand includes a plurality of first lines or bit lines BL121 and a plurality of second lines or word lines WL intersecting the bit lines BL121. At intersections of the word lines WL and the bit line BL121, memory cells MC of the cross-point type shown in FIG. 3 are formed. The bit line BL121 is connected to a column control circuit, not shown, on the silicon substrate SB via contacts CT121, CT121' extending downward in the stack direction through between the bit lines BL111 and BL112 in the cell array layer MA110 in the lower layer.

Figure 5B:
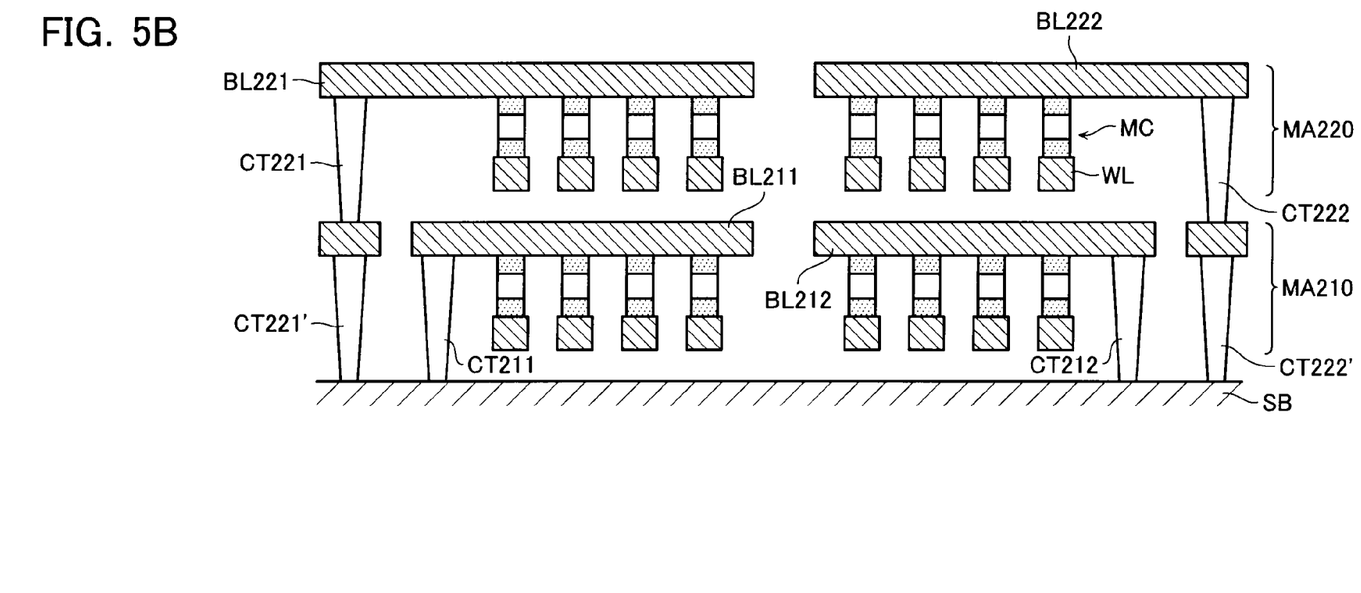
FIG. 5B is a cross-sectional view showing an arrangement of memory cells, word lines, bit lines and contacts in a semiconductor memory device according to a comparison example.

FIG. 5B is a cross-sectional view showing an arrangement of memory cells, word lines, bit lines and contacts in a comparison example.

There is a silicon substrate SB, on which a cell array layer MA210 in a lower layer and a cell array layer MA220 in an upper layer are formed.

Conventionally, bit lines BL in a semiconductor substrate device having a stacked structure are divided into the same number among all cell array layers MA in many cases. In the case of FIG. 5B, the bit lines BL in the cell array layers MA210, MA220 are divided at the respective center into two: bit lines BL211 and BL212; and bit lines BL221 and BL222. These bit lines BL211, BL212, BL221, BL222 are connected to a column control circuit, not shown, on the silicon substrate SB via contacts CT211, CT212, CT221 and CT221', CT222 and CT222', respectively.

A comparison of the cross-sectional view in the present embodiment with that in the comparison example finds that the contact arrangement region for connecting the contact CT to the silicon substrate SB in the present embodiment is one location less than the comparison example as obvious from FIGS. 5A and 5B. As a result, the contact arrangement region provided on the silicon substrate SB can be reduced. The number of bit lines divided in the cell array layer MA120 in the upper layer may be made smaller than the number of bit lines divided in the cell array layer MA110 in the lower layer. As a result, the space between the bit lines BL111 and BL112 in the lower layer not utilized in the comparison example can be utilized to arrange the contact CT in the upper layer therein, thereby reducing the space in the chip area. Further, the contact positions of the contacts CT on the silicon substrate SB can be dispersed to produce a margin of space for arranging circuits such as a column decoder formed on the silicon substrate SB.

Another embodiment is exemplified below, which is similarly capable of reducing the space of the chip area by varying the number of divided bit lines BL among the cell arrays MA.

Second Embodiment

Figure 6:
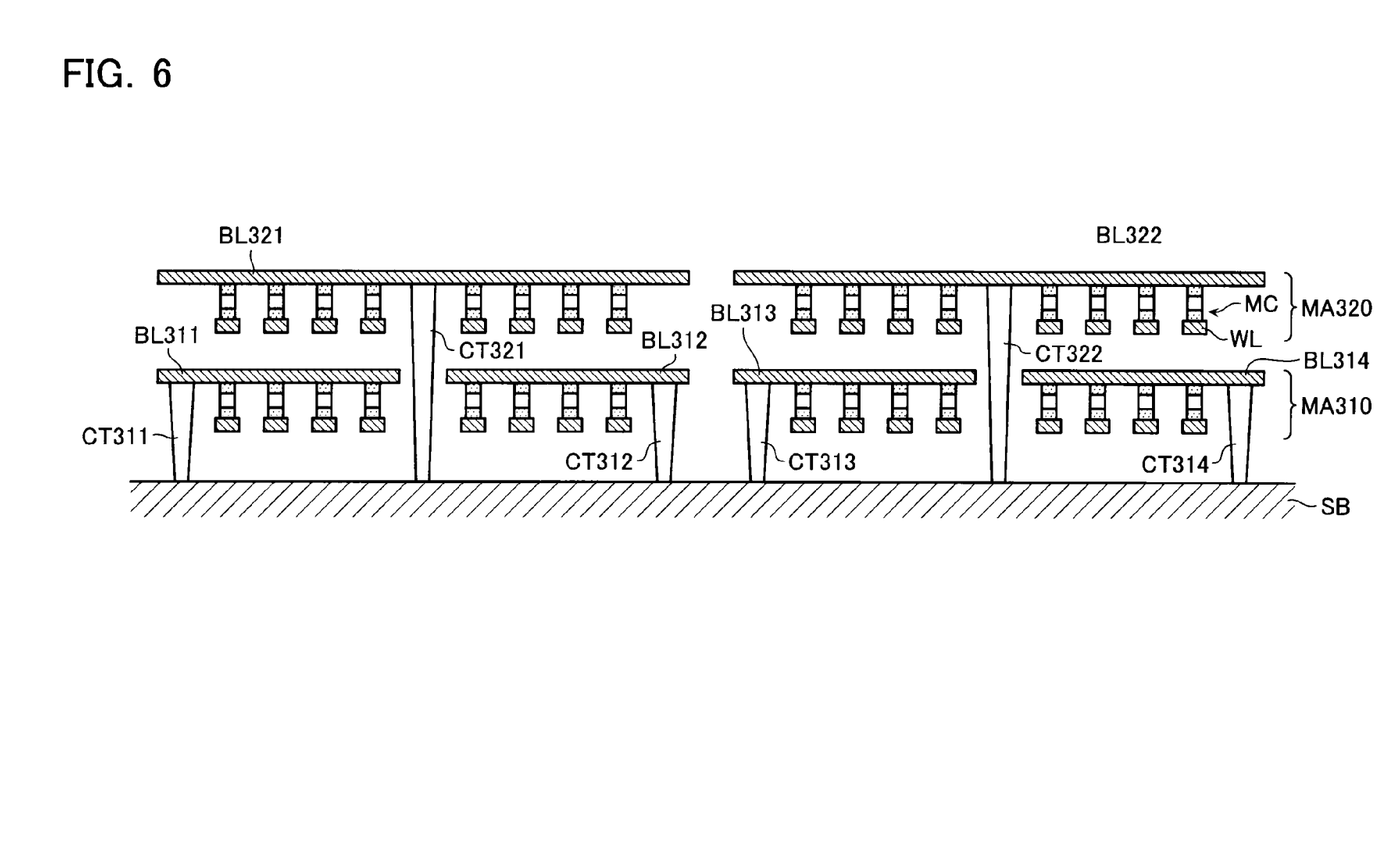
FIG. 6 is a cross-sectional view showing an arrangement of memory cells, word lines, bit lines and contacts in a semiconductor memory device according to a second embodiment.

FIG. 6 is a cross-sectional view showing an arrangement of memory cells, word lines, bit lines and contacts in a semiconductor memory device according to a second embodiment.

There is a silicon substrate SB, on which a cell array layer MA310 in a lower layer and a cell array layer MA320 in an upper layer are formed.

The cell array layer MA310 in the lower layer includes a plurality of first lines or bit lines BL and second lines or word lines WL, mutually intersecting. A bit line BL is divided into four bit lines BL311, BL312, BL313 and BL314 at equal intervals. At intersections of these bit lines BL311, BL312, BL313 and BL314 and the word lines WL, memory cells MC of the cross-point type shown in FIG. 3 are connected. The bit lines BL311, BL312, BL313, BL314 are connected to a column control circuit, not shown, on the silicon substrate SB via contacts CT311, CT312, CT313, CT314, respectively.

The cell array layer MA320 in the upper layer includes a plurality of first lines or bit lines BL and second lines or word lines WL, mutually intersecting. A bit line BL is divided into a bit line BL321 and a bit line BL322. At intersections of the bit lines BL321 and BL322 and the word lines WL, memory cells MC of the cross-point type shown in FIG. 3 are connected. The bit lines BL321, BL322 are connected to a column control circuit, not shown, on the silicon substrate SB via contacts CT321, CT322 provided between the bit lines BL311, BL312 and between the bit lines BL313, BL314 in the lower layer and extending downward in the stack direction.

This configuration makes the contacts CT two pieces fewer than the semiconductor memory device that includes bit lines BL divided into four in the upper and lower layers both.

Third Embodiment

Figure 7:
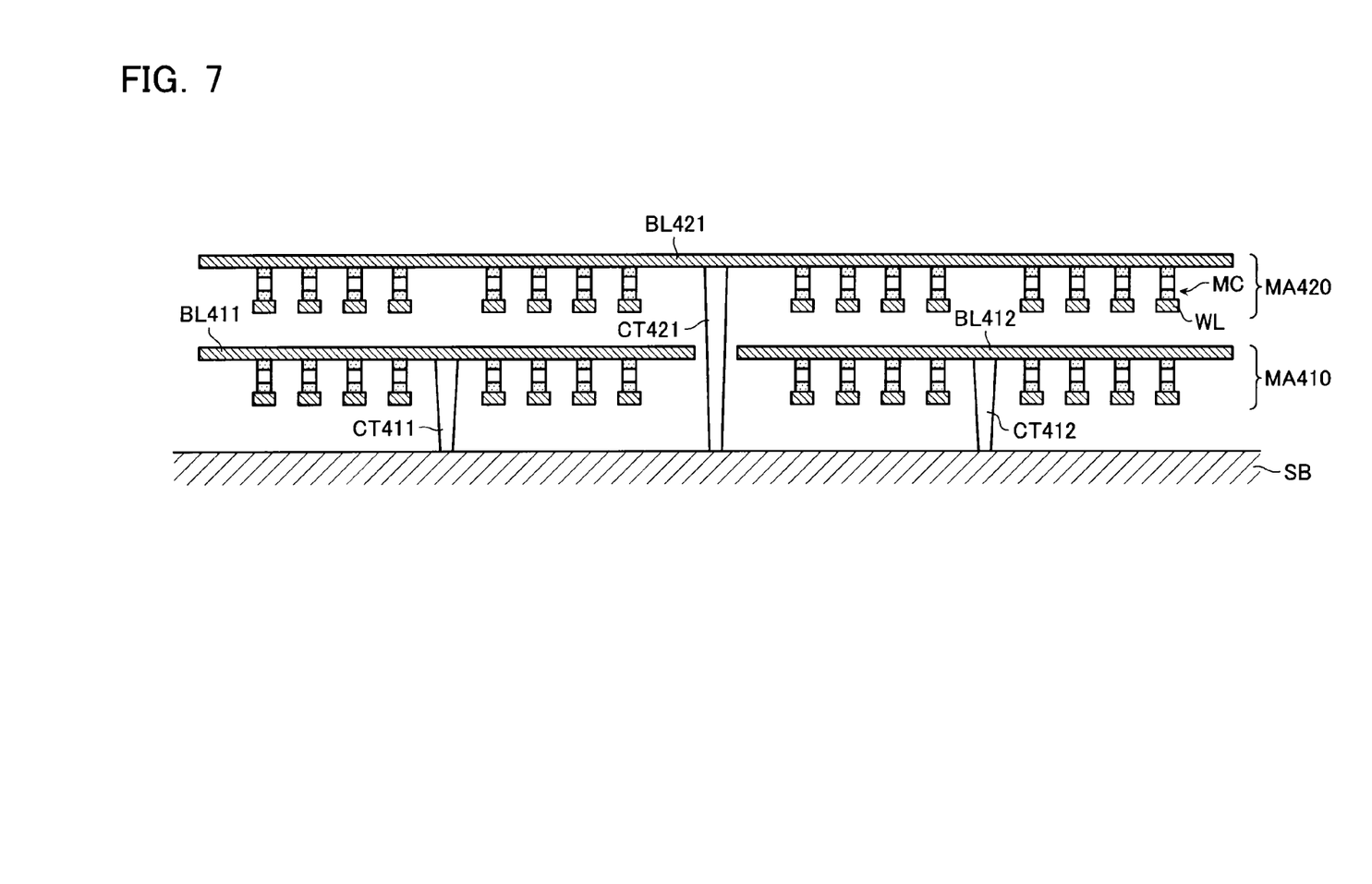
FIG. 7 is a cross-sectional view showing an arrangement of memory cells, word lines, bit lines and contacts in a semiconductor memory device according to a third embodiment.

FIG. 7 is a cross-sectional view showing an arrangement of memory cells, word lines, bit lines and contacts in a semiconductor memory device according to a third embodiment.

There is a silicon substrate SB, on which a cell array layer MA410 in a lower layer and a cell array layer MA420 in an upper layer are formed.

The cell array layer MA410 in the lower layer includes a plurality of first lines or bit lines BL and second lines or word lines WL, mutually intersecting. A bit line BL is divided into bit lines BL411, BL412. At intersections of the bit lines BL411 and BL412 and the word lines WL, memory cells MC of the cross-point type shown in FIG. 3 are connected. The bit lines BL411, BL412 are connected to a column control circuit, not shown, on the silicon substrate SB via contacts CT411, CT412, respectively.

The cell array layer MA420 in the upper layer on the other hand includes a plurality of first lines or bit lines BL421 and second lines or word lines WL, mutually intersecting. At intersections of these bit line BL421 and the word lines WL, memory cells MC of the cross-point type shown in FIG. 3 are connected. The bit line BL421 is connected to a column control circuit, not shown, on the silicon substrate SB via a contact CT421 provided between the bit lines BL411, BL412 in the lower layer and extending downward in the stack direction.

This configuration makes the contacts CT one piece fewer than the semiconductor memory device that includes bit lines BL divided into two in the upper and lower layers both. The space at both ends can be utilized as contacts for other signal lines with the silicon substrate SB.

In either of the second and third embodiments, the number of the divided bit lines BL is larger in the lower layer than the upper layer. Therefore, the space between the bit lines BL produced in accordance with the division of the bit lines BL in the lower layer can be utilized to arrange the contact CT in the upper layer and further reduce the space of the chip area.

Fourth Embodiment

Figure 8:
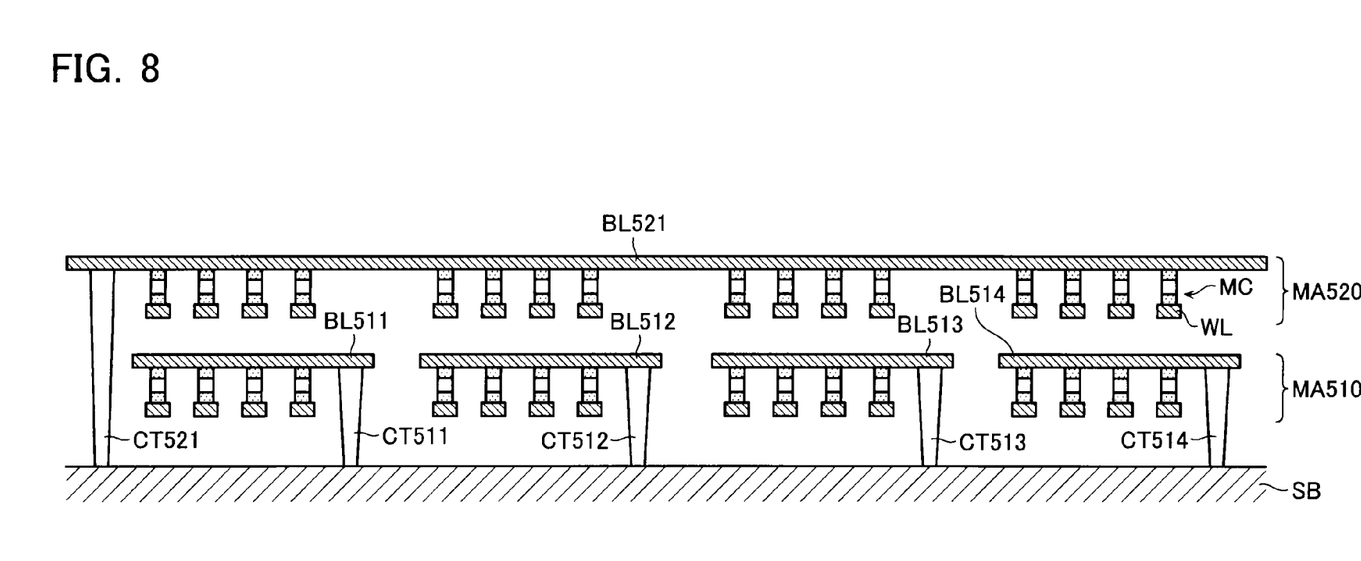
FIG. 8 is a cross-sectional view showing an arrangement of memory cells, word lines, bit lines and contacts in a semiconductor memory device according to a fourth embodiment.

FIG. 8 is a cross-sectional view showing an arrangement of memory cells, word lines, bit lines and contacts in a semiconductor memory device according to a fourth embodiment.

There is a silicon substrate SB, on which a cell array layer MA510 in a lower layer and a cell array layer MA520 in an upper layer are formed.

The cell array layer MA510 in the lower layer includes a plurality of first lines or bit lines BL and second lines or word lines WL, mutually intersecting. A bit line BL is divided into bit lines BL511, BL512, BL513 and BL514 at equal intervals. At intersections of these bit lines BL511, BL512, BL513 and BL514 and the word lines WL, memory cells MC of the cross-point type shown in FIG. 3 are connected. The BL511, BL512, BL513, BL514 are connected to a column control circuit, not shown, on the silicon substrate SB via contacts CT511, CT512, CT513, CT514, respectively.

The cell array layer MA520 in the upper layer includes a plurality of first lines or bit lines BL521 and second lines or word lines WL, mutually intersecting. At intersections of the bit lines BL521 and the word lines WL, memory cells MC of the cross-point type shown in FIG. 3 are connected. The bit lines BL521 are connected to a column control circuit, not shown, on the silicon substrate SB via a contact CT521 provided at the left side of the bit line BL511 in the lower layer.

This configuration makes the contacts CT three pieces fewer than the semiconductor memory device that includes bit lines BL divided into four in the upper and lower layers both. In addition, the contact positions of five contacts CT511-514, 521 on the silicon substrate SB can be dispersed to produce a margin of space for arranging circuits such as a column decoder formed on the silicon substrate SB.

In either of the second through fourth embodiments, the number of the divided bit lines is larger in the lower layer than the upper layer. Therefore, compared with the configuration having the number of the divided bit lines BL in the upper layer matched with the number of the divided bit lines BL in the lower layer, the number of the contacts CT can be made smaller and the contact arrangement area on the silicon substrate SB can be reduced.

Fifth Embodiment

The above description has been given with attention focused on the reduction in space by the contact arrangement area on the silicon substrate SB and the contact path. The reduction in space may be also achieved in the peripheral circuit elements such as a column control circuit provided on the silicon substrate.

Figure 9:
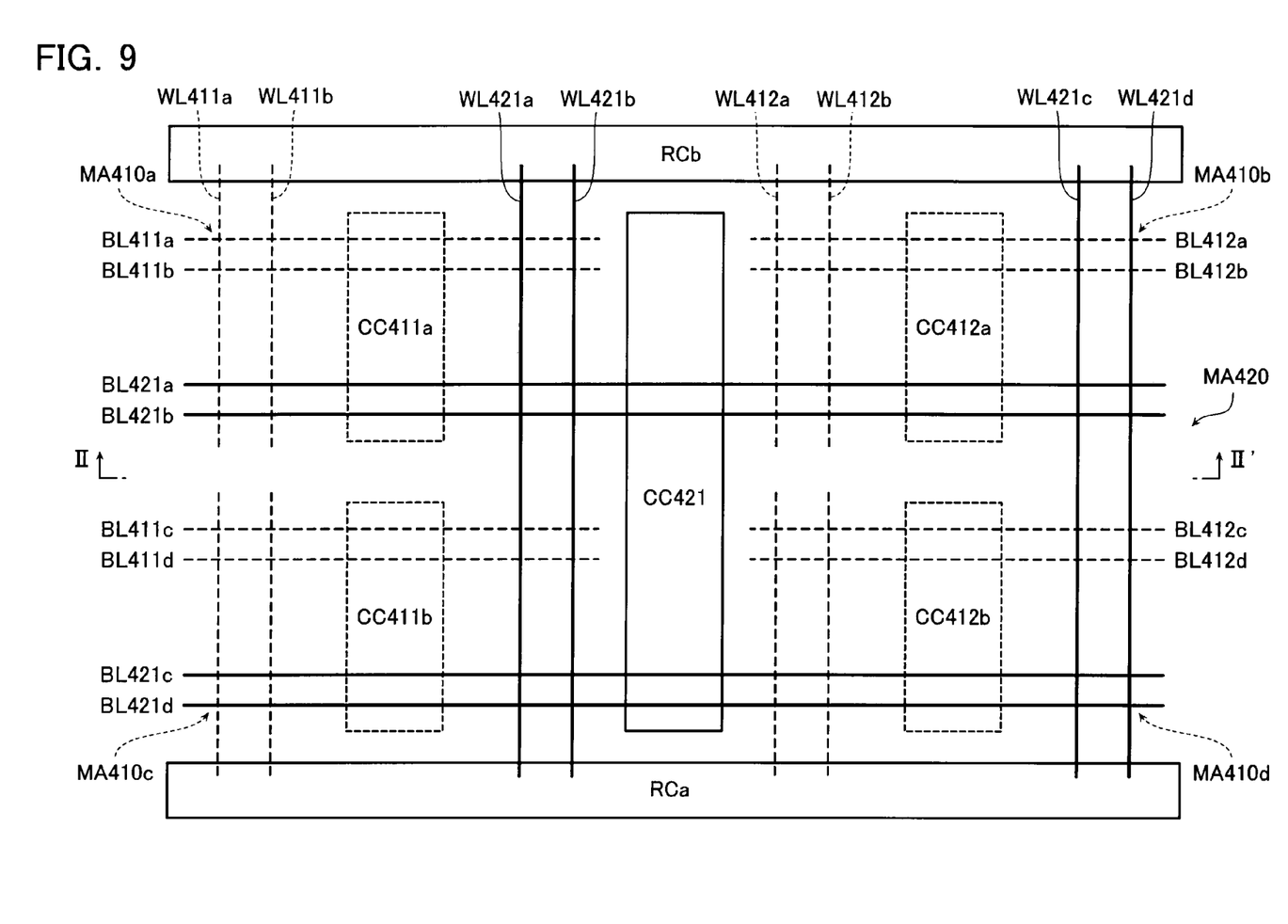
FIG. 9 shows a fifth embodiment in a block diagram, which shows an arrangement of word lines, bit lines and peripheral circuit elements in the semiconductor memory device of FIG. 7 seen from above.

FIG. 9 shows a fifth embodiment in a block diagram, which shows an arrangement of word lines, bit lines and peripheral circuit elements in the semiconductor memory device of FIG. 7 seen from above. The bit lines BL, word lines WL and peripheral circuit elements in the cell array layer MA in the lower layer are shown with dotted lines. FIG. 7 corresponds to the II-II' section in FIG. 9.

The cell array layer MA410 in the lower layer is divided into two in the word line direction and in the bit line direction both to create four areas MA410a, MA410b, MA410c, MA410d in total. Arranged beneath these areas MA410a, MA410b, MA410c, MA410d (in the inner parts behind the page of FIG. 9) at the center in the word line direction are column control circuits CC411a, CC412a, CC411b, CC412b, which are formed on the silicon substrate SB and connected via contacts CT to the bit lines BL in the respective areas.

On the other hand, the cell array layer MA420 in the upper layer includes a single area that covers the areas MA410a-MA410d. The bit lines BL421 in the cell array layer MA420 are formed on the silicon substrate SB and connected via contacts CT421 to a column control circuit CC421 arranged at the center in the word line direction.

The word lines WL in the cell array layers MA410 and MA420 are connected to row control circuits RCa, RCb formed on the silicon substrate SB.

In accordance with the arrangement shown in FIG. 9, the space located between the areas MA411a, MA412a and between the areas MA411b, MA412b and produced on the silicon substrate SB in the inner parts behind the page of FIG. 9 can be utilized to arrange the column control circuit CC421 in the cell array layer MA420 in the upper layer therein.

As obvious from the above, the present embodiment makes it possible to arrange peripheral circuit elements such as column control circuits on the silicon substrate efficiently and thus reduce the chip area.

Sixth Embodiment

In the first through fifth embodiments, the description is given to such the semiconductor memory device that includes the cell array layers MA all having word lines WL and bit lines BL independently. The present invention, however, also exerts the same effect on a semiconductor memory device that includes two vertically adjacent cell array layers MA sharing the word lines WL or the bit lines BL.

The following description is given to an embodiment in such the case.

Figure 10:
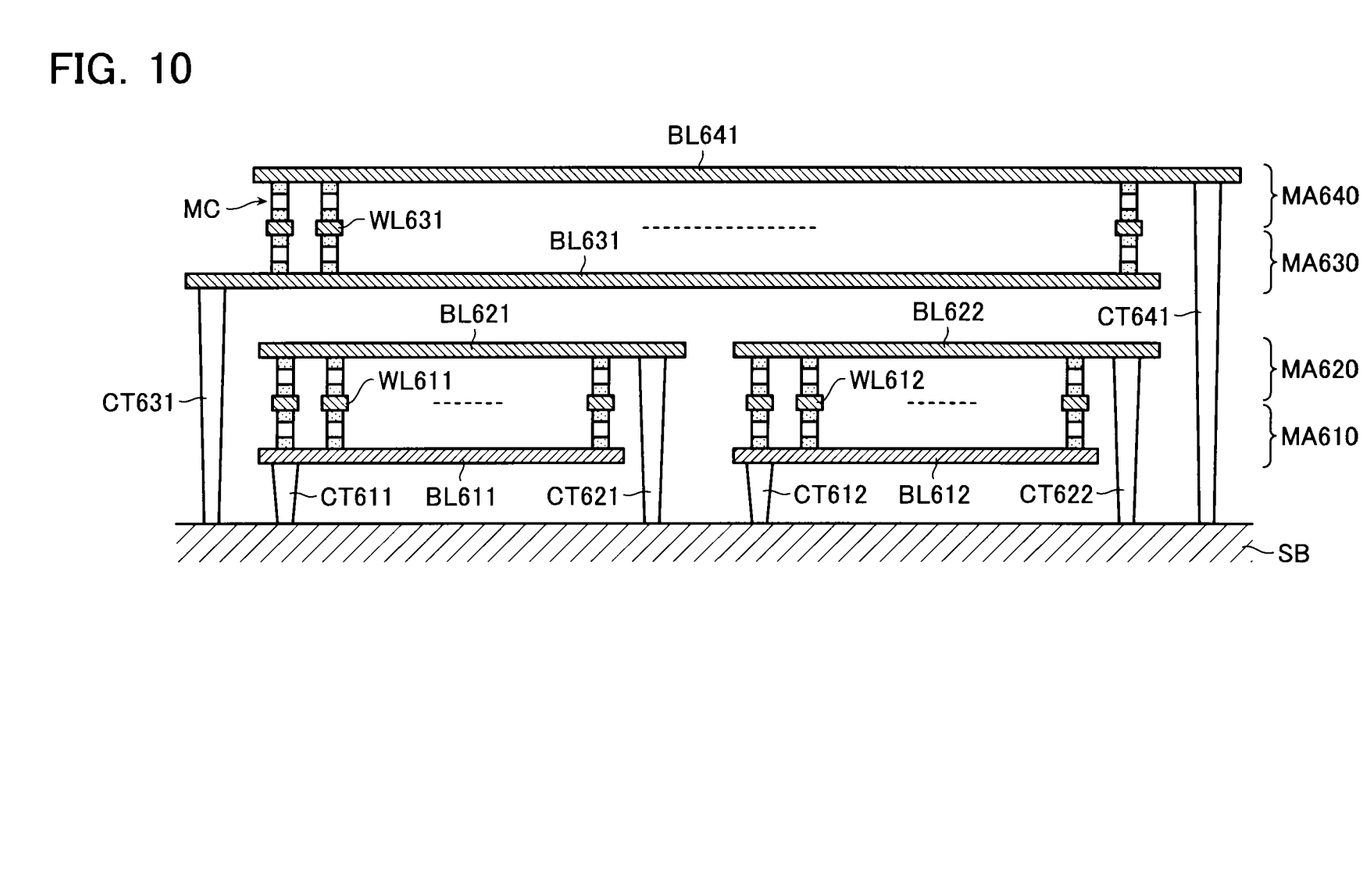
FIG. 10 is a cross-sectional view showing an arrangement of memory cells, word lines, bit lines and contacts in a semiconductor memory device according to a sixth embodiment.

FIG. 10 is a cross-sectional view showing an arrangement of memory cells, word lines, bit lines and contacts in a semiconductor memory device according to a sixth embodiment.

There is a silicon substrate SB, on which cell array layers MA610, MA620, MA630 and MA640 are formed from a lower layer to an upper layer.

The cell array layer MA610 includes a plurality of first lines or bit lines BL and a plurality of second lines or word lines WL611, WL612 intersecting the bit lines BL. A bit line BL is divided at the center into bit lines BL611 and BL612. At intersections of the bit lines BL611 and BL612 and the word lines WL611 and WL612, memory cells MC of the cross-point type shown in FIG. 3 are formed. The bit lines BL611, BL612 are connected to a column control circuit, not shown, on the silicon substrate SB via contacts CT611, CT612 provided at the respective left ends.

The cell array layer MA620 includes a plurality of first lines or bit lines BL and a plurality of second lines or word lines WL611, WL612 intersecting the bit lines BL and shared with the cell array layer MA610. A bit line BL is divided at the center into bit lines BL621 and BL622. At intersections of the bit lines BL621 and BL622 and the word lines WL611 and WL612, memory cells MC of the cross-point type shown in FIG. 3 are formed. The bit lines BL621 is connected to a column control circuit, not shown, on the silicon substrate SB via a contact CT621 connected to the right end and provided between the bit lines BL611 and BL612. On the other hand, the bit lines BL622 is connected to a column control circuit, not shown, on the silicon substrate SB via a contact CT622 connected to the right end and provided at the left side of the bit line BL612.

The cell array layer MA630 includes a plurality of first lines or bit lines BL631 and a plurality of second lines or word lines WL631 intersecting the bit lines BL631. At intersections of the bit line BL631 and the word line WL631, memory cells MC of the cross-point type shown in FIG. 3 are formed. The bit lines BL631 is connected to a column control circuit, not shown, on the silicon substrate SB via a contact CT631 connected to the left end and provided at the left side of the bit lines BL621, BL611.

The cell array layer MA640 includes a plurality of first lines or bit lines BL641 and a plurality of second lines or word lines WL631 intersecting the bit lines BL641 and shared with the cell array layer MA640. At intersections of the bit line BL631 and the word line WL631, memory cells MC of the cross-point type shown in FIG. 3 are formed. The bit lines BL641 is connected to a column control circuit, not shown, on the silicon substrate SB via a contact CT641 provided on the right side of the bit lines BL631, BL622, BL612.

Seventh Embodiment

Figure 11:
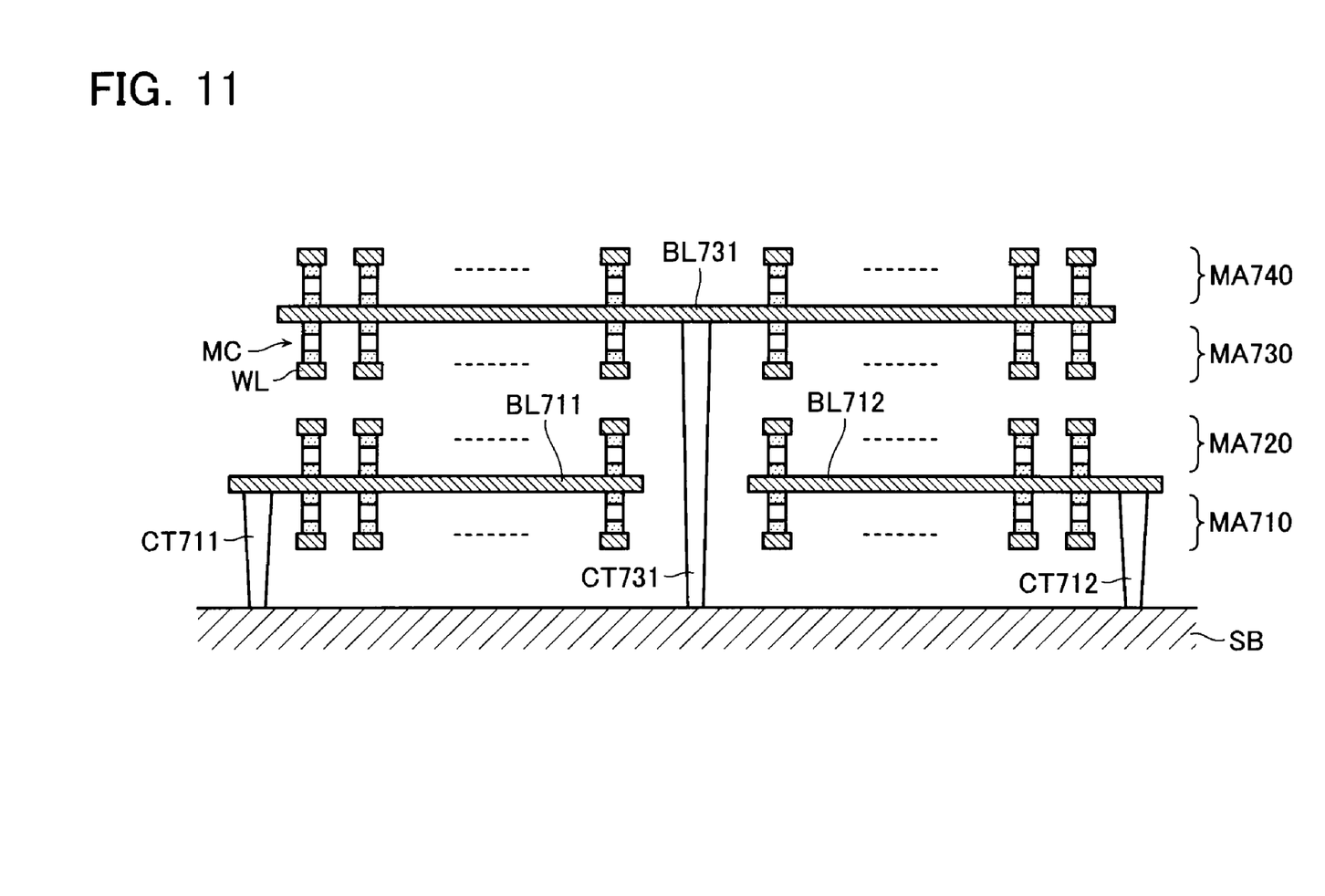
FIG. 11 is a cross-sectional view showing an arrangement of memory cells, word lines, bit lines and contacts in a semiconductor memory device according to a seventh embodiment.

FIG. 11 is a cross-sectional view showing an arrangement of memory cells, word lines, bit lines and contacts in a semiconductor memory device according to a seventh embodiment.

There is a silicon substrate SB, on which cell array layers MA710, MA720, MA730, MA740 are formed from a lower layer to an upper layer.

The cell array layer MA710 includes a plurality of first lines or bit lines BL and a plurality of second lines or word lines WL intersecting the bit lines BL. A bit line BL is divided at the center into bit lines BL711 and BL712. At intersections of the bit lines BL711 and BL712 and the word lines WL, memory cells MC of the cross-point type shown in FIG. 3 are formed.

The cell array layer MA720 includes a plurality of first lines or bit lines BL and a plurality of second lines or word lines WL intersecting the bit lines BL. The bit line BL are the bit lines BL711 and BL712 shared with the cell array layer MA710. At intersections of the bit lines BL711 and BL712 and the word lines WL, memory cells MC of the cross-point type shown in FIG. 3 are formed.

The bit lines BL711 is connected to a column control circuit, not shown, on the silicon substrate SB via a contact CT711 connected to the left end. On the other hand, the bit line BL712 is connected to a column control circuit, not shown, on the silicon substrate SB via a contact CT712 connected to the right end.

The cell array layer MA730 includes a plurality of first lines or bit lines BL731 and a plurality of second lines or word lines WL intersecting the bit lines BL731. At intersections of the bit lines BL731 and the word lines WL, memory cells MC of the cross-point type shown in FIG. 3 are formed.

The cell array layer MA740 includes a plurality of first lines or bit lines BL731 and a plurality of second lines or word lines WL intersecting the bit lines BL, shared with the cell array layer MA730. At intersections of the bit lines BL731 and the word lines WL, memory cells MC of the cross-point type shown in FIG. 3 are formed.

The bit line BL731 is connected to a column control circuit, not shown, on the silicon substrate SB via a contact CT731 connected at the center and provided between the bit lines BL711 and BL712.

FIG. 10 shows an example associated with the semiconductor memory device of which two cell array layers MA share non-divided word lines WL while FIG. 11 shows an example associated with the semiconductor memory device of which two cell array layers MA share divided bit lines BL.

In accordance with these examples, the contacts CT can be made fewer than the semiconductor memory device having the number of the divided bit lines BL in the upper layer made equal to the number of the divided bit lines BL in the lower layer, regardless of whether they are shared between two cell array layers MA or not, thereby reducing the contact arrangement area. The number of the divided bit lines BL in the upper layer may be made smaller than that of the divided bit lines BL in the lower layer, thereby providing a contact CT in the upper layer within the space produced by dividing the bit lines BL in the lower layer.

The above effect allows the present embodiment to provide a semiconductor memory device having a reduced chip area.

Eighth Embodiment

Figure 12:
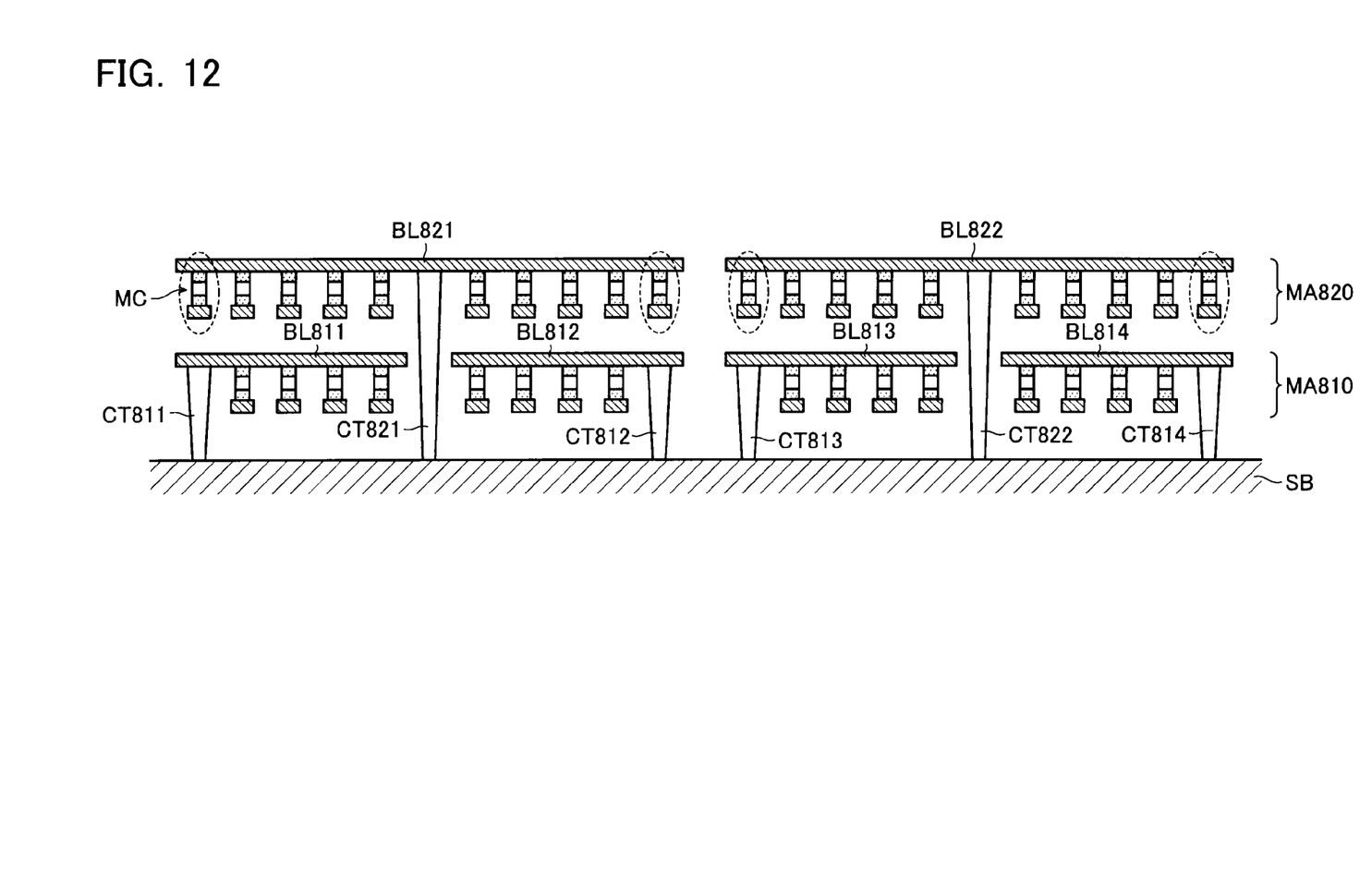
FIG. 12 is a cross-sectional view showing an arrangement of memory cells, word lines, bit lines and contacts in a semiconductor memory device according to an eighth embodiment.

FIG. 12 is a cross-sectional view showing an arrangement of memory cells, word lines, bit lines and contacts in a semiconductor memory device according to an eighth embodiment.

There is a silicon substrate SB, on which a cell array layer MA810 in a lower layer and a cell array layer MA820 in an upper layer are formed.

The cell array layer MA810 includes a plurality of first lines or bit lines BL and second lines or word lines WL intersecting the bit lines BL. A bit line BL is divided into bit lines BL811, BL812, BL813 and BL814 at equal intervals. At intersections of these bit lines BL811, BL812, BL813 and BL814 and the word lines WL, memory cells MC of the cross-point type shown in FIG. 3 are formed. The bit lines BL811, BL813 are connected to a column control circuit, not shown, on the silicon substrate SB via contacts CT811, CT813 connected to the left end, respectively. On the other hand, the bit lines BL812, BL814 are connected to a column control circuit, not shown, on the silicon substrate SB via contacts CT812, CT814 connected to the right end, respectively.

The cell array layer MA820 includes a plurality of first lines orbit lines BL and second lines or word lines WL intersecting the bit lines BL. A bit line BL is divided into bit lines BL821 and BL822. At intersections of these bit lines BL821 and BL822 and the word lines WL, memory cells MC of the cross-point type shown in FIG. 3 are formed. The bit line BL821 is connected to a column control circuit, not shown, on the silicon substrate SB via a contact CT821 connected at the center and provided between the bit lines BL811 and BL812. On the other hand, the bit line BL822 is connected to a column control circuit, not shown, on the silicon substrate SB via a contact CT822 connected at the center and provided between the bit lines BL813 and BL814.

In this structure, the bit line BL in the upper layer is smaller in the contact arrangement area and less in the space produced by division than the bit line BL in the lower layer and accordingly has a bit line BL with a longer line length per division. For example, the bit line BL821 in the upper layer and the bit lines BL811 and BL812 in the lower layer have a length almost half the bit line BL. In this case, it is sufficient to provide only an arrangement area for the contact CT821 in the bit line BL821 in the upper layer. In contrast, the bit lines BL811 and BL812 in the lower layer require the space produced between the bit lines BL811 and BL812 and arrangement areas for contacts CT811 and CT812 connected to the bit lines. Therefore, the cell array layer MA820 in the upper layer with a smaller number of divided lines and contacts CT can ensure larger arrangement areas for much more memory cells MC than the cell array layer MA810 in the lower layer. Thus, the bit lines BL821, BL822 in the upper layer can be connected to extra memory cells MC as shown with dotted lines in FIG. 12. The extra memory cells MC may be utilized as redundancy relief memory cells.

Thus, the present embodiment makes it possible to provide a semiconductor memory device having a reduced chip area and a larger capacity.

Others

In either of the above embodiments, the line length of one bit line is different from others among the cell array layers and this relation causes differences in the speed of access to a memory cell and the number of memory cells connected to one bit line.

Specifically, in the case of the third embodiment shown in FIG. 7, the bit line BL411 in the lower layer has a line length about half the bit line BL421 in the upper layer. Therefore, compared with the memory cell MC connected to the bit line BL421, the memory cell MC connected to the bit line BL411 can be accessed faster. In contrast, the number of the memory cells MC connected to the bit line BL421 is double the number of the memory cells MC connected to the bit line BL411 and as large a capacity of data as the extent can be handled in batch.

With the above characteristics, a higher convenient semiconductor memory device can be realized. In a word, the need for batch processing large capacity data may make access to a cell array layer in a much higher layer while the need for fast access may make access to a cell array layer in a much lower layer, as can be used properly.

The use of memory cells capable of storing multivalue (tertiary or higher) data as the memory cells can make the above characteristics more remarkable. In a word, the use of a multivalue memory cell capable of handling many values in the cell array layer in a much higher layer can make larger the data capacity in the cell array layer in the higher layer.

On the other hand, there may be a need for averaging the time required for access to memory cells in all cell array layers and the batch-processible data capacities. Such the need can be satisfied with the use of a multivalue memory cell capable of handing a much larger value in the cell array layer in a much lower layer.

The above description is given to the semiconductor memory device having the number of divided bit lines in the upper layer made smaller than the number of divided bit lines in the lower layer. The similar effect can be exerted if the number of divided bit lines is made smaller in the upper layer than the lower layer.

The first line is described as the bit line and the second line as the word line though the similar effect can be exerted if the first line is the word line and the second line is the bit line.

What is claimed is:
1. A semiconductor memory device, comprising:
a semiconductor substrate;
a memory block formed on said semiconductor substrate and including plural stacked cell array layers of cell arrays each comprising a plurality of first lines, a plurality of second lines crossing said plurality of first lines, and memory cells connected at intersections of said first and second lines between both lines; and
a plurality of contacts extending in the stack direction of said cell array layers and connecting said first lines in said cell arrays with diffusion regions formed on said semiconductor substrate,
wherein a certain one of said cell array layers is smaller in the number of said first lines divided and the number of contacts connected than said cell array layer in a lower layer located closer to said semiconductor substrate than said certain one.

2. The semiconductor memory device according to claim 1, wherein the number of memory cells connected to one said first line in said certain cell array layer is larger than the number of memory cells connected to one said first line in said cell array layer in said lower layer.

3. The semiconductor memory device according to claim 1, wherein said memory cell exists between said contact connected to said first line in said certain cell array layer and said contact connected to said first line in said cell array layer in said lower layer.

4. The semiconductor memory device according to claim 1, wherein each memory cell in said certain cell array layer stores N-valued data (N is an integer of 2 or more) while each memory cell in said cell array layer in said lower layer stores M-valued data (M is an integer larger than N).

5. The semiconductor memory device according to claim 1, wherein each memory cell in said certain cell array layer stores N-valued data (N is an integer of 3 or more) while each memory cell in said cell array layer in said lower layer stores M-valued data (M is smaller than N, and M is an integer of 2 or more).

6. The semiconductor memory device according to claim 1, wherein said memory cell includes an electrically programmable resistive memory element.

7. The semiconductor memory device according to claim 1, wherein said first line in said certain cell array layer is shared with said cell array layer adjoining thereto in the stack direction.

8. A semiconductor memory device, comprising:
a semiconductor substrate;
a memory block formed on said semiconductor substrate and including plural stacked cell array layers of cell arrays each comprising a plurality of first lines, a plurality of second lines crossing said plurality of first lines, and memory cells connected at intersections of said first and second lines between both lines; and
a plurality of contacts extending in the stack direction of said cell array layers and connecting said first lines in said cell arrays with diffusion regions formed on said semiconductor substrate,
wherein a certain one of said cell array layers is smaller in the number of said first lines divided than said cell array layer in a lower layer located closer to said semiconductor substrate than said certain one, wherein said first line in said cell array layer in an upper layer is connected to diffusion regions formed on said semiconductor substrate via said contact passing through the dividing space between said first lines in said cell array layer in said lower layer.

9. The semiconductor memory device according to claim 8, wherein the number of memory cells connected to one said first line in said certain cell array layer is larger than the number of memory cells connected to one said first line in said cell array layer in said lower layer.

10. The semiconductor memory device according to claim 8, wherein said memory cell exists between said contact connected to said first line in said certain cell array layer and said contact connected to said first line in said cell array layer in said lower layer.

11. The semiconductor memory device according to claim 8, wherein each memory cell in said certain cell array layer stores N-valued data (N is an integer of 2 or more) while each memory cell in said cell array layer in said lower layer stores M-valued data (M is an integer larger than N).

12. The semiconductor memory device according to claim 8, wherein each memory cell in said certain cell array layer stores N-valued data (N is an integer of 3 or more) while each memory cell in said cell array layer in said lower layer stores M-valued data (M is smaller than N, and M is an integer of 2 or more).

13. The semiconductor memory device according to claim 8, wherein said memory cell includes an electrically programmable resistive memory element.

14. The semiconductor memory device according to claim 8, wherein said first line in said certain cell array layer is shared with said cell array layer adjoining thereto in the stack direction.

15. A semiconductor memory device, comprising:
a semiconductor substrate;
a memory block formed on said semiconductor substrate and including plural stacked cell array layers of cell arrays each comprising a plurality of first lines, a plurality of second lines crossing said plurality of first lines, and memory cells connected at intersections of said first and second lines between both lines; and
a plurality of contacts extending in the stack direction of said cell array layers and connecting said first lines in said cell arrays with diffusion regions formed on said semiconductor substrate,
wherein a certain one of said cell array layers is smaller in the number of said first lines divided than said cell array layer in a lower layer located closer to said semiconductor substrate than said certain one, and has said memory cell in a portion of said first line, corresponding to the dividing space between said first lines in said cell array layer in said lower layer.

16. The semiconductor memory device according to claim 15, wherein said memory cell exists between said contact connected to said first line in said certain cell array layer and said contact connected to said first line in said cell array layer in said lower layer.

17. The semiconductor memory device according to claim 15, wherein each memory cell in said certain cell array layer stores N-valued data (N is an integer of 2 or more) while each memory cell in said cell array layer in said lower layer stores M-valued data (M is an integer larger than N).

18. The semiconductor memory device according to claim 15, wherein each memory cell in said certain cell array layer stores N-valued data (N is an integer of 3 or more) while each memory cell in said cell array layer in said lower layer stores M-valued data (M is smaller than N, and M is an integer of 2 or more).

19. The semiconductor memory device according to claim 15, wherein said memory cell includes an electrically programmable resistive memory element.

20. The semiconductor memory device according to claim 15, wherein said first line in said certain cell array layer is shared with said cell array layer adjoining thereto in the stack direction.

* * * * *